United States Patent [19]

Argyle et al.

[11] 4,118,793
[45] Oct. 3, 1978

[54] GRADIENTLESS PROPULSION OF MAGNETIC BUBBLE DOMAINS USING MODULATED IN-PLANE FIELDS

[75] Inventors: Bernell Edwin Argyle, Putnam Valley, N.Y.; Pieter Dekker, Kortenhoef, Netherlands; John Casimir Slonczewski, Katonah, N.Y.

[73] Assignee: International Business Machines Corporation, Armonk, N.Y.

[21] Appl. No.: 758,887

[22] Filed: Jan. 12, 1977

[51] Int. Cl.² ............................................. G11C 19/08
[52] U.S. Cl. ........................................... 365/30; 365/3
[58] Field of Search .................. 340/174 TF; 365/30, 365/3

[56] References Cited

U.S. PATENT DOCUMENTS

| | | | |
|---|---|---|---|
| 4,052,710 | 10/1977 | Calhoun et al. | 365/3 |
| 4,068,220 | 1/1978 | Argyle et al. | 365/30 |

OTHER PUBLICATIONS

IBM Journal of Research Development, Mar. 1976, pp. 109–122.

*Primary Examiner*—James W. Moffitt
*Attorney, Agent, or Firm*—Jackson E. Stanland

[57] ABSTRACT

Magnetic bubble domains are propagated in a magnetic medium in a desired direction using in-plane magnetic fields which are time varying but which have no spatial gradients. In applications such as information storage, the need for conventional propagation structures, such as offset conductor loops, patterned magnetic elements, and patterned ion implantation regions is reduced. Bubble domains having unwinding pairs of Bloch lines in their wall magnetization can be moved by applying appropriate in-plane magnetic fields, without the need for spatial gradients or variations in the magnetic field normal to the plane of the magnetic medium. The continuous movement of these bubble domains occurs by a cyclic process where the Bloch lines switch between two configurations, in an asymmetric way in response to the time varying in-plane field.

25 Claims, 26 Drawing Figures

$T_R$ = 150 ns
$T_P$ = 350 ns
$T_F$ = 1 μs

GRADIENTLESS PROPULSION OF MAGNETIC BUBBLE DOMAINS USING MODULATED IN-PLANE FIELDS

BACKGROUND OF THE INVENTION

1. Field of the Invention

This invention relates to improved techniques for utilizing magnetic bubble domains, and more particularly to novel techniques for moving and discriminating between different types of these bubble domains using in-plane magnetic fields which are time varying and spatially uniform. Bubble domains are moved in a magnetic medium without the need for spatial magnetic gradients acting on the bubbles.

2. Description of the Prior Art

In the bubble domain art, many techniques are known for moving magnetic bubble domains. These techniques generally require the presence of active overlays, such as conductor overlays and magnetic element overlays. Thus, either by application of current to conductor overlays, or by application of reorienting in-plane magnetic fields, bubble domains can be made to follow prescribed paths in the bubble domain medium. Still another type of bubble domain propagation utilizes modulations of the bias field in combination with wedge-shaped patterns of magnetic material. The bubble domain is made to expand and contract and will thereby be moved along from one triangular wedge to the next due to the asymmetry of wall motion produced by the triangular wedges. In all these types of bubble propagation schemes, some type of overlay structure is generally used to provide the forces which move the bubbles.

In copending application Ser. No. 659,880, filed Feb. 20, 1976, and assigned to the present assignee, a new type of bubble domain propagation, termed automotion, is described which utilizes time varying magnetic fields which are spatially uniform. As an example, a time varying magnetic field directed along the cylinder axis of the bubble domain is applied in order to change (precess) the wall magnetization vector distribution along the bubble domain wall. This in turn provides a reaction force which moves the bubble domains in a desired direction. In order to have continuous bubble motion in response to the time varying magnetic field, the original state of the domain wall magnetization vectors is generally restored by a D.C. magnetic field prior to each application of the time varying magnetic field. This type of bubble domain motion does not require active overlay structures and has several advantages, as are pointed out in that copending application.

Another copending application, Ser. No. 697,170, filed June 17, 1976 and now U.S. Pat. No. 4,068,220, describes how to selectively and controllably convert one wall magnetization distribution of a bubble to a different wall magnetization distribution and how to use the principles of bubble automotion to sense the resulting wall state. In particular, techniques are shown for applying magnetic fields to bubble domains having winding number $S=1$ for conversion to a new configuration bubble which still has winding number $S=1$. As will be appreciated by those of skill in the art, the winding number S, or revolution number, is the number of rotations the wall moment at a point P makes when P goes once around the periphery of the domain wall. This concept is described in more detail in U.S. Pat. No. 3,890.605, assigned to the present assignee, and in an article by J. C. Slonczewski et al, 18th Annual Conference on Magnetism and Magnetic Materials, Denver, Colo., which appeared in the AIP Conference Proceedings 10, p. 458 (Nov. 28–Dec. 1, 1972).

The concept of bubble domain automotion using gradientless magnetic fields, described in the aforementioned copending applications, has also been described in an article entitled "Gradientless Propulsion of Magnetic Bubble Domains", by B. E. Argyle et al, which appeared in the Journal of Magnetism and Magnetic Materials, Volume 2, No. 4, July/August 1976, at pp. 357–360. In addition, reference is made to an invited paper by B. E. Argyle et al, entitled "Gradientless Propulsion of Bubble Domains" presented as Paper 7A-1 at the Joint MMM-Intermag Conference, June 15–18, 1976, at Pittsburgh, Pa. The text of this presentation is in AIP Conference Proceedings No. 34, p. 131, 1976.

Whereas the previously described techniques for bubble automotion have been demonstrated using time varying magnetic fields directed along the easy axis of magnetization of the magnetic bubble film, the present invention utilizes time varying magnetic fields which are in the plane of the magnetic bubble domain medium. These time varying, in-plane magnetic fields are spatially uniform and act directly on the magnetization vectors in the bubble wall to produce a direct bubble translation by action on these vectors. This is in contrast with the previously described type of bubble automotion in which the translation is secondary to a change in radius of the bubble domains occurring when they are subjected to time varying magnetic fields directed along the bubble domain axis. Thus, while the previously described bubble domain automotion and the present technique for bubble automotion both apply spatially invariant, time varying magnetic fields to the bubble domains in order to effect their wall magnetization distribution, the present invention differentiates from that previous automotion technique (termed type I automotion) in several ways.

In the present type of automotion, the bubble domain center can displace by a greater amount per applied magnetic field pulse than was the case for type I automotion. The control of velocity afforded by the direct action of the in-plane field on the Bloch lines, rather than indirect action through a radius change, leads to easy optimization of the mean velocity. Further, in this second type of automotion, termed Automotion Type II, the bubble domain is less likely to undergo a state change when being automoted. Field coils similar to those used for T-I bar structures can be utilized. For a given bubble diameter, the optimum data rate is comparable to that of T and I-bar devices. Since in-plane fields are used, bias field margins in the bubble chip are not adversely affected. Even when the magnetic bubble domains have small diameters, the magnetic field strengths of the time-varying field are comparable to those used in T and I bar devices. Another desirable feature of type II automotion is that a multiplicity of automotion directions is available merely by changing the signs of the in-plane fields used to translate the bubbles. These advantages and features will become more apparent in the detailed description of the preferred embodiments.

Accordingly, it is a primary object of the present invention to produce bubble domain automotion using a direct coupling of the applied magnetic fields to the wall magnetization vectors in the periphery of the domain wall.

It is another object of the present invention to utilize time varying, spatially uniform magnetic fields in the plane of the bubble domain medium for moving bubble domains.

A further object of the present invention is to provide bubble domain propagation using in-plane magnetic fields, by a technique which is not lithography-limited.

A still further object of the present invention is to provide additional techniques for discriminating magnetic bubble domains which have differing wall structures and the same, or different, winding numbers.

A further object of this invention is to provide bubble domain propagation of very small bubble domains, using magnetic drive fields whose amplitudes are readily attainable.

BRIEF SUMMARY OF THE INVENTION

Magnetic bubble domains are propagated in a magnetic medium using a time-varying spatially uniform magnetic field in the plane of the magnetic medium. No structural overlays are required for movement of the bubble domains using these magnetic fields, since type II automotion does not depend on the need for magnetic gradients acting on the bubble domains.

In particular, the invention can be used to propagate magnetic bubble domains having certain types of wall magnetization configurations. When the in-plane time varying magnetic field is applied, magnetization vectors localized within the wall of the domain precess in the correct planes to constitute a displacement of the domain center. In contrast with type I automotion, type II automotion does not rely on a change in bubble size in order to cause precession of the magnetization vectors. Rather, the in-plane magnetic fields directly act on the magnetization vectors to cause the appropriate precession. This provides a more efficient type of automotion and, as will be seen later, the displacement per pulse is greater for type II automotion than for type I automotion.

In one embodiment, a steady, in-plane magnetic field is used to orient the magnetization vector distribution in the bubble domain, and a time varying, in-plane magnetic field oriented at other than 0° to the steady field is used to provide gyrotropic forces for movement of the bubble domain. The steady magnetic field typically is used to restore the magnetization vector distribution in the domain wall to its original form with respect to the center of the domain, prior to application of the in-plane, time varying magnetic field pulse. This allows type II automotion to continually occur with each incidence of the time varying magnetic field pulse. Thus, the original wall magnetization distribution tends to be restored by the steady, in-plane field and makes excursions induced by the time varying in-plane field. After the vector redistribution, the steady field restores the original distribution. At this time, application of another time varying in-plane field pulse will again produce type II automotion. In this manner, the bubble domain will continually move across the magnetic medium.

In another embodiment, at least two time varying magnetic fields are provided in the plane of the bubble domain medium. The combination of these two time varying magnetic fields is similar to a rotating magnetic field in the plane of the bubble medium. One of the time varying magnetic fields is used to provide an asymmetry to insure that the rotation of wall magnetization vector distribution in the domain wall is continually in the same direction, while the other time varying in-plane field provides the necessary forces for precession of the wall vectors. In this second embodiment, the wall magnetization vector distribution continually circulates around the domain wall, always moving in the same direction around the wall. In contrast with this, the first embodiment provides precession of the wall vectors for a certain distance around the wall, after which the wall vectors are restored to substantially their original positions by circulating back over the same paths along which they circulated when the pulse was first applied.

In type II automotion there is a cyclic process of wall magnetization circulation between first and second distributions. However, this must be done in an asymmetric way in order to have the bubble exhibit a net displacement in a desired direction. For example, when a sufficiently fast time varying in-plane field is applied, the magnetization vectors will redistribute to a new configuration, leading to a force which displaces the bubble in a first direction. When the time-varying field disappears, the original vector configuration will be restored, which will produce an oppositely directed force. If this second force is not sufficient to overcome coercivity, the bubble won't automote in the reverse direction, and there will be a new displacement in the first direction.

Thus, bubble domain automotion proceeds in an asymmetric process in which the effect on the bubble when the pulse is applied is different than the effect when the pulse is removed.

Bubble domains which respond to type I or type II automotion are those having at least two unwinding Bloch lines in their wall magnetization. Also, bubble domains having Bloch points and vertical Bloch lines can be moved by type II automotion, as can unichiral bubbles having at least one $2\pi$ horizontal Bloch line.

As is the case with automotion type I, automotion type II can be used to move bubble domains in devices such as bubble lattice devices. Further, automotion type II can be used to detect different types of bubble domains, and particularly bubble domains having different wall structures yet the same winding number. This is possible, since these different domains will automote in different directions under the same applied in-plane magnetic fields.

These and other objects, features, and advantages will be more apparent from the following more particular description of the preferred embodiments.

BRIEF DESCRIPTION OF THE DRAWINGS

FIG. 2A is a top view of the bubble domain of FIG. 2B, taken along the mid-plane of the bubble of FIG. 2B. A Bloch point is contained in the front Bloch line.

FIG. 4A shows a $\sigma_+$ bubble while FIG. 4B shows a $\sigma_-$ bubble. FIG. 5A shows a $\phi_1$ bubble while FIG. 5B shows a $\phi_2$ bubble. FIG. 6A shows a $\pi_+$ bubble while FIG. 6B shows a $\pi_-$ bubble. The notations $\sigma$, $\phi$ and $\pi$ have been arbitrarily utilized to designate these bubbles.

FIG. 9A shows the bubble domain wall state before application of the automotion field $h_p(t)$, FIG. 9B shows the amplitude $h_p$ of an asymmetric automotion field $h_p(t)$ as a function of time, FIG. 9C shows the amplitude $h_p$ of a symmetric automotion field $h_p(t)$ as a function of time, and FIG. 9D illustrates the precession of the wall magnetization vectors of the bubble domain when $h_p(t)$ is first applied.

DETAILED DESCRIPTION OF THE PREFERRED EMBODIMENTS

Introduction

Bubble domain movement by type II automotion utilizes the direct effect of magnetic fields on the wall magnetization configuration of bubbles. It is not necessary to have gradient magnetic fields act on the bubbles, as has been done in the past (prior to automotion type I) for continuous movement of bubble domains in practical devices. Instead, spatially uniform time varying magnetic fields are utilized to provide transient or oscillatory torques acting on the wall moments of the bubbles in order to precess them and consequently cause displacement of the bubble domain. In one embodiment, a restoring force is provided by a d.c. field to restore the initial configuration of wall magnetization in the domains so that the time varying magnetic field will repeatedly exert forces for movement of bubbles in a desired direction. In another embodiment, a magnetic field is used to insure that the circulation direction of wall moment distribution is the same for all magnetization vectors around the domain wall periphery even during restoration of the vectors toward their original positions. Depending upon the waveform of the time varying magnetic field and the wall configuration, automotion can be achieved with many different types of bubble domains.

The direction of movement of the bubble is determined by the directions of the in-plane fields, their magnitudes, and by the particular wall configuration of the bubble. The in-plane magnetic field used for restoration and/or insuring the direction of precession of wall moments can be eliminated if the bubble domain material has a crystallographic structure that provides inherent restoring forces (via orthorhombic anisotropy, for example) on the wall moments of the bubble, tending always to restore these wall moments to one of two static positions in the absence of the time modulated bias field.

An in-plane anisotropy, originating from crystallinity (as in a 111-film) or from a small tilt of the 111-axis away from the film normal, may be substituted for one of the in-plane magnetic fields. The operation will then be modified because in-plane anisotropy produces two equivalent orientations. For the rotating embodiment to be shown in FIGS. 11 and 12, an advantageous operation is obtained by directing the external magnetic field $h_p(t)$ along an axis at e.g. 45° to the in-plane easy axis. Then a waveform having a fast rise time to a positive amplitude, slow fall time to a negative amplitude, and then a slow rise time to zero (then repeated again for as many cycles as needed to move the bubble the desired distance) will cause automotion if the amplitude exceeds the threshold for destabilizing the VBL positions imposed by the in-plane anisotropy.

FIGS. 1, 2A, 2B and 3

Figure 1:
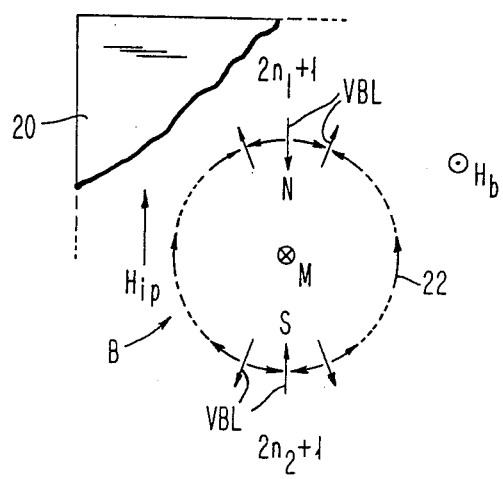
FIG. 1 is a schematic illustration of a bubble domain with a generalized wall magnetization state that can be moved by type II automotion.
Figure 2A:
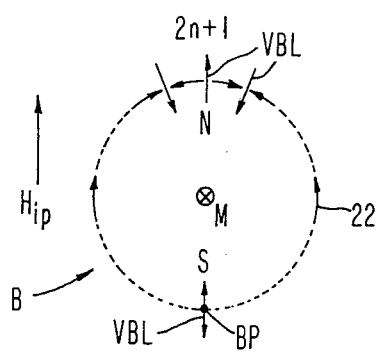
FIGS. 2A and 2B illustrate another bubble domain which can be moved by type II automotion, where
Figure 2B:
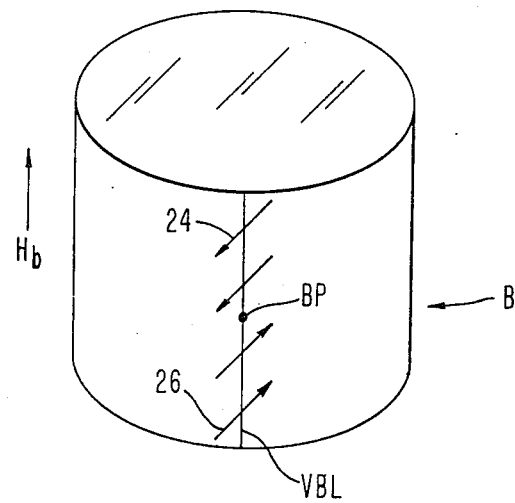
Figure 3:
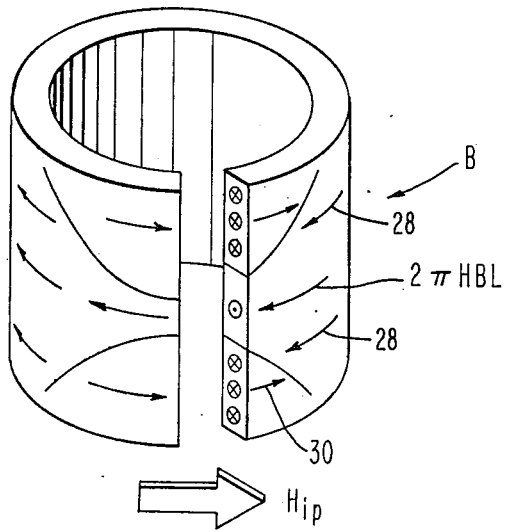
FIG. 3 illustrates another bubble domain which can be moved by type II automotion, where this bubble is characterized by a $2\pi$ horizontal Bloch line HBL.

FIGS. 1, 2A, 2B and 3 illustrate the wall magnetization configurations of bubble domains which are exemplary of those which can be moved by type II automotion in accordance with the principles of this invention. In particular, FIG. 1 and FIGS. 2A, 2B illustrate bubble domains having vertical Bloch lines VBL's in their wall structure while FIG. 3 illustrates a bubble domain having a $2\pi$ horizontal Bloch line HBL in its wall structure.

In FIG. 1, a bubble domain material 20 has a bubble domain B therein which has a wall magnetization configuration generally illustrated by the direction of arrows 22. Arrows 22 are directed along the periphery of domain B, except within the vertical Bloch line transition regions VBL where their direction varies continually, as is well known in the art. In this regard, reference is made to U.S. Pat. No. 3,890,605 which illustrates magnetic domain systems using bubble domains having differing numbers of vertical Bloch lines.

Figure 1A:
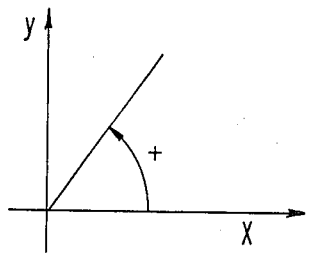
FIG. 1A indicates the positive sense of winding of wall magnetization of the bubble domains indicated by FIG. 1, as well as for the bubble domains shown in succeeding figures, where the sense of winding refers to the direction of twist of magnetization vectors within a domain wall as the wall periphery is traversed in the positive sense.

Domain B has two clusters of vertical Bloch lines, the upper cluster containing $(2n_1 + 1)$ negative BL's while the lower cluster contains $(2n_2 + 1)$ positive BL's. The notation (−, +) indicates the sense of the local VBL winding on traversing the wall periphery, in accordance with the convention shown in FIG. 1A. Hence, the sense of winding for the top cluster of VBL's is negative while that for the bottom cluster of VBL's is positive.

In FIG. 1, $n_1$ and $n_2$ are integers having values 0, 1, 2, ... so that there will be an odd number of Bloch lines in each cluster. If $n_1 = n_2$, the number of VBL's in each cluster will be the same.

The field $H_{ip}$ is in the plane of magnetic medium 20 and prevents Bloch lines having opposite twists from approaching each other and unwinding to annihilate one another. That is, this field provides a restoring force tending to provide separate clusters of VBL's in the wall of domain B. The upper cluster constitutes overall a north magnetic pole N and the lower cluster constitutes overall a south magnetic pole S.

FIG. 2A illustrates a domain B which is similar to that of FIG. 1, except that the lower cluster of VBL's contains a single VBL having a Bloch point (BP) therein. As is known in the art, this is a vertical Bloch line having a singularity along its length. This is illustrated more clearly by FIG. 2B, where the vertical Bloch line has a Bloch point along its length separating regions having wall moments oppositely directed as indicated by arrows 24 and 26. The top cluster of VBL's contains (2n+1) VBL's as indicated.

Another bubble domain which will move when in-plane time varying magnetic fields are applied to it is the bubble domain illustrated in FIG. 3. This domain B is characterized by a $2\pi$ horizontal Bloch line HBL separating regions of the domain wall having oppositely directed wall moments, as illustrated by arrows 28 and 30.

FIGS. 4–6

Figure 4A:
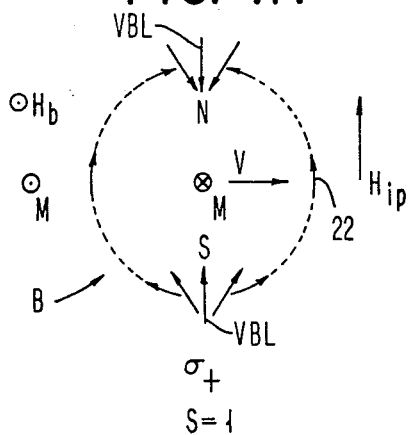
FIGS. 4A, 4B, 5A, 5B and 6A, 6B illustrate wall magnetizations for several bubble domains which can be moved by type II automotion. In particular.
Figure 4B:
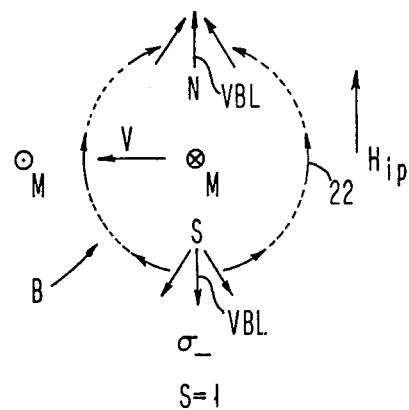

These figures illustrate specific examples of bubble domains which can be automated using time varying in-plane fields. FIGS. 4A and 4B illustrate two kinds of bubble domains having the same winding numbers S=1. This winding number, or revolution number, is the number of rotations the wall moment makes going around the periphery of the domain wall. It is described in more detail in aforementioned U.S. Pat. No. 3,890,605, and in the aforementioned article by J. C. Slonczewski et al which appeared in the AIP Conference Proceedings 10, p. 458 (1972). In all of these figures, the magnetization M of the bubble is into the paper while the magnetization M outside the bubble is directed out of the paper. As will be seen later, $\sigma_+$ and $\sigma_-$ bubbles automote in opposite directions and are therefore distinguishable using automotion principles.

Figure 5A:
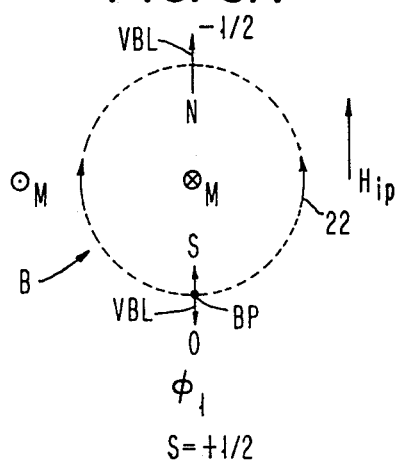
Figure 5B:
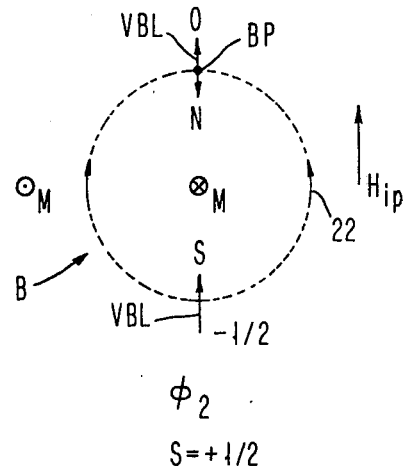

FIGS. 5A and 5B show the wall magnetization states of bubble domains indicated as $\phi_1$ and $\phi_2$. Both $\phi_1$ and $\phi_2$ bubble domains contain one vertical Bloch line with local winding number $-\frac{1}{2}$, and a vertical Bloch line having a Bloch point therein.

Figure 6A:
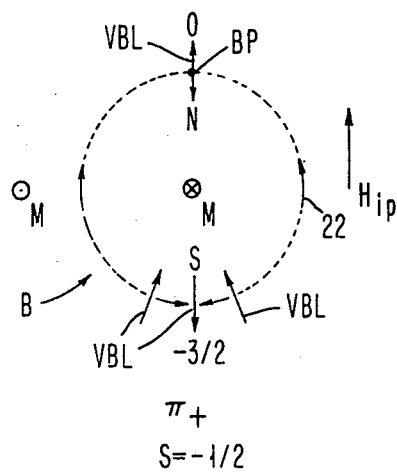
Figure 6B:
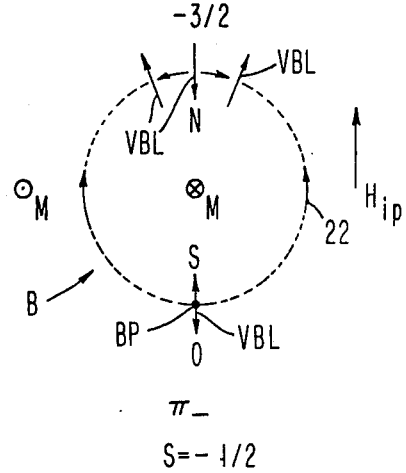

FIGS. 6A and 6B show two $\pi$-state bubble domains, designated $\pi_+$ and $\pi_-$. The $\pi$-state bubbles have winding numbers $S = -\frac{1}{2}$. A $\pi_+$ domain and a $\pi^-$ domain will automote along opposite directions.

In FIG. 6A, the $\pi_+$ domain has a winding number $S = -\frac{1}{2}$, and is characterized by a single vertical Bloch line having a Bloch point BP (local winding number zero) and an opposite cluster of VBL's which has a local winding number of $-3/2$.

The $\pi_-$ bubble of FIG. 6B also contains a single vertical Block line with a Bloch point therein (local winding number zero) and three vertical Bloch lines having local winding number $-3/2$.

Theory of Automotion Type II

In type II automotion, modulated in-plane magnetic fields act directly on the wall moments in the bubble to cause precession of these moments. Generally, it is desired that all parts of the moment distribution circulate in the same direction. This eliminates the problem of Bloch lines meeting and annihilating each other and also provides larger excursion (a half turn instead of a quarter turn, as in type I automotion) of the Bloch lines with each applied magnetic field pulse. Since the Bloch lines can move 180° around the domain wall without annihilating one another if their circulation is in a common circular direction, the net displacement of the Bloch lines in type II automotion is a maximum. Since the domain displacement is a reaction to the Bloch line motion, this is the reason why type II automotion provides maximum bubble domain displacement per magnetic field pulse.

The limits of the magnitudes of the applied in-plane fields are determined by nucleation of Bloch points and by dynamic conversion. That is, the magnitude of the modulated in-plane field should be such that a Bloch point is not nucleated in any existing Bloch line and should be such that the bubble domain does not exceed its saturation velocity in the material. If the saturation velocity is not exceeded, dynamic conversion (nucleation of Bloch-line pairs constituting state changes) will not occur.

Figure 6C:
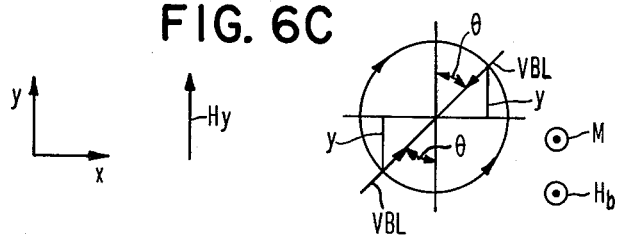
FIG. 6C shows a bubble domain having one pair of vertical Bloch lines. This figure is used to explain the theory of automotion, Type II.

Reference to the aforementioned articles considering type I automotion is helpful in appreciating the theory of type II automotion. Consequently, the following explanation of type II automotion will be quite brief. A bubble domain B having one pair of vertical Bloch lines VBL is shown in FIG. 6C, which also shows the magnetic field $H_y$ and the bias field $H_b$. The angles $\theta$ between the $y$ direction and the line connecting the VBL's are also indicated.

The limiting case of a bubble hop caused by instantaneous reversal of the in-plane field $H_y$ is now considered in order to estimate the maximum automotive displacement. Two general approximations apply to this situation. These are:

1. The deflection effect, causing any bubble of unit winding number to move at an angle to the net force, can be neglected. In other words, the gyrotropic force $4\pi M\gamma^{-1}\hat{z} \times \vec{V}$ on a simple unichiral bubble domain can be neglected. Here, M is the magnetization of the bubble material, $\gamma$ is the gyromagnetic ratio, $\hat{z}$ is a unit vector in the z-direction, and $\vec{V}$ is the velocity of the domain center. (All forces in this discussion are per unit film thickness.)

2. The viscous damping of the Bloch lines can be neglected under the condition $$2\alpha/\pi Q^{\frac{1}{2}} << 1.$$

The remaining gyrotropic force on any vertical Bloch line is $$\pm 2\pi M\gamma^{-1} z \times \vec{V}_{BL}$$

where $\vec{V}_{BL}$ is the Bloch-line velocity. The sign (±) depends on the twist sense within the Bloch line. As an example, neither of these assumptions is badly violated for 5 micron bubbles in EuGaFe-garnet materials.

For simplicity, assume that the motion of the center is constrained to move in the x-direction as an approximation to the actual curve. Let $x$ be the position of the bubble center and $y$ be the $y$ coordinate of the upper VBL. (See above figure.) Balancing the x-component forces, with $\dot{x} > 0$, one finds $$\mp 2 \times 2\pi M\gamma^{-1} \dot{y} = 2\pi r M\alpha \, \dot{x}/\gamma\Delta + 8rMH_c \tag{1}$$

where $H_c$ is the flat-wall coercivity, $\alpha$ is the Gilbert damping constant, $r$ is the domain radius, $\Delta = \sqrt{A/K}$ is the wall thickness, · means $d/dt$, and the (−) sign is for $\sigma_+$ bubbles while the (+) sign is for $\sigma_-$ bubbles. This equation balances the gyrotropic forces of the two VBL's on the left against the bubble drag on the right.

The only y-component forces are due to $H_y$ acting on the line-charge distributions, and the gyrotropic reaction of their x-motion. The part of the latter due to rotation cancels out, leaving only that due to translation $\dot{x}$ of the bubble center.

The balance is simply $$-2 \times 2\pi\Delta MH_y \pm 2 \times 2\pi M\gamma^{-1} \dot{x} = 0 \tag{2}$$

Let $H_y$ be proportional to the unit step function. Integration of Equation (2) leads to $$X_T = \pm T\Delta H_y \gamma \tag{3}$$

where $T$ is the length of time required for $y$ to attain its equilibrium value $y = r$ and $\pm X_T$ is the displacement of the $\sigma_+$ or $\sigma_-$ bubble after a time T. Assuming $y = -r$ at $t = 0$, Equation (1) integrates to give, after rearranging, $$X_T = \frac{\pm \Delta}{\frac{\alpha}{4} + \frac{H_c}{\pi H_y}} \tag{4}$$

Note that $H_c$ is related to the coercive gradient $(dH_z/dx)_c$ for a bubble by $$H_c = \frac{\pi}{4} r \left(\frac{dH_z}{dx}\right)_c \tag{5}$$

so that $$X_T = \frac{\pm 4\Delta}{\alpha + \frac{r(dH_z/dx)_c}{H_y}} \tag{6}$$

From these equations, it is clear that materials with smaller damping parameter $\alpha$ will produce significantly larger displacements $|X_T|$. The displacement is reduced by coercivity and the rise time of the applied in-plane field pulse should be sufficiently fast that coercive effects are overcome. Since $X_T$ varies inversely with damping parameter $\alpha$, type II automotion can be utilized experimentally to determine the damping parameter, especially in low damping materials which are difficult to measure by other techniques.

The calculated limiting bubble velocity $|X_T|/T = \Delta\gamma H_y$ can approach saturation or the threshold for Bloch line nucleation ($10^3$ cm/sec for 5 micron garnets) if $H_y$ and $dH_y/dt$ are too large ($H_y \lesssim 10$ Oe for step-function pulses).

Thus, the time varying in-plane field pulse acts directly on the Bloch lines to invert their arrangement in a controllable manner. This action in turn produces gyrotropic forces which displace the center of the bubble domain in a direction depending on the direction of the applied in-plane fields.

FIG. 7

This figure shows a generalized structure for producing in-plane magnetic fields having arbitrary directions and amplitudes. In this particular example, external sets of x and y field coils are used to produce magnetic fields along the x and y directions. Depending upon how these fields are combined, variations of net in-plane magnetic fields can be produced.

In more detail, magnetic material 20 is adjacent to x-field coils 32 and y-field coils 34. The x-coils 32 are connected to a current source 36 which provides excitation current $I_x$, while y-coils 34 are connected to current source 38, which supplies excitation current $I_y$.

Surrounding the entire magnetic medium 20 and in the plane of this medium is a bias field coil 40, which is connected to the bias current source 42. Activation of source 42 produces the current $I_b$ in coil 40.

A control unit 44 is connected to the current sources 36, 38 and 42 for control of the operation of these sources. The sources themselves produce currents having selected amplitudes, rise times, fall times, and pulse widths in accordance with the type of magnetic field desired. For example, embodiment 1 (to be described with respect to FIGS. 9A, 9B and 9C) utilizes a steady magnetic field in one direction and a time varying magnetic field pulse in an orthogonal direction. This can be achieved by having a constant current $I_y$ and a pulse current $I_x$. Simultaneously, constant current $I_b$ produces the stabilizing bias field $H_b$, which maintains the bubble domain diameter.

Through the use of well known electronic current sources, the waveforms of the currents $I_x$ and $I_y$ can be adjusted as desired. Further, coils 32 and 34 need not be orthogonal to one another, but can be at arbitrary angles to one another, to provide magnetic fields which are at arbitrary angles with respect to one another.

Figure 7:
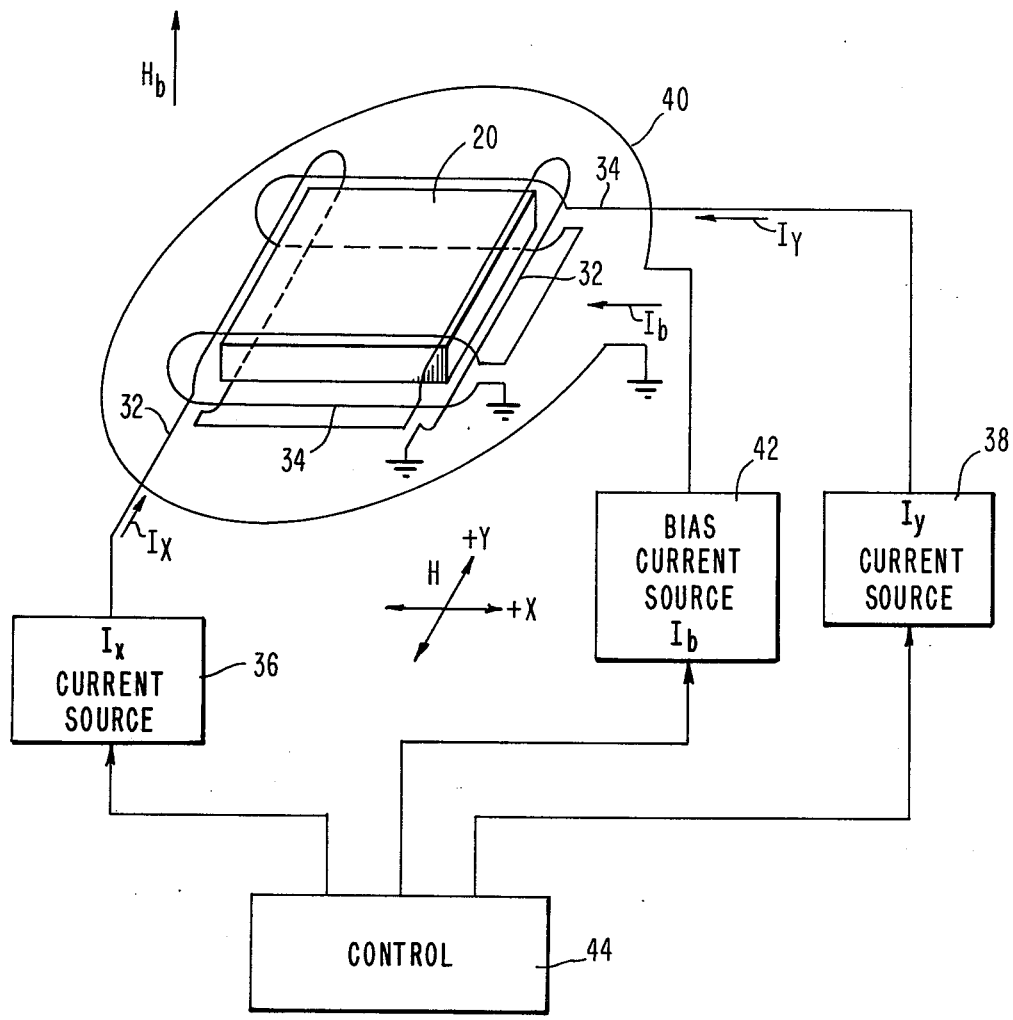
FIG. 7 shows an apparatus which can be used to provide the magnetic fields necessary for movement of bubble domains by type II automotion.

As will be appreciated by those of skill in the art, the external field coils shown in FIG. 7 are typically those used to provide a reorienting magnetic field of the type used in field-access magnetic bubble domain devices. Further, the bias coil 40 is of a type well known in the art for providing the stabilizing bias field. Still further, it will be readily appreciated that, instead of using the external field coils, suitably designed strip conductors can be located over the magnetic material 20 to provide the desired in-plane magnetic fields.

DIRECTIONS OF AUTOMOTION (FIGS. 8A, 8B)

Figure 8A:
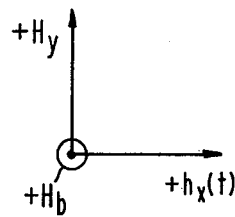
FIG. 8A shows a set of magnetic fields used to automote $\sigma_+$ and $\sigma_-$ bubble domains, where $H_y$ is a steady, in-plane field, $h_x(t)$ is a time varying, in-plane field, and $H_b$ is a steady bias field normal to the plane of the bubble domain medium.
Figure 8B:
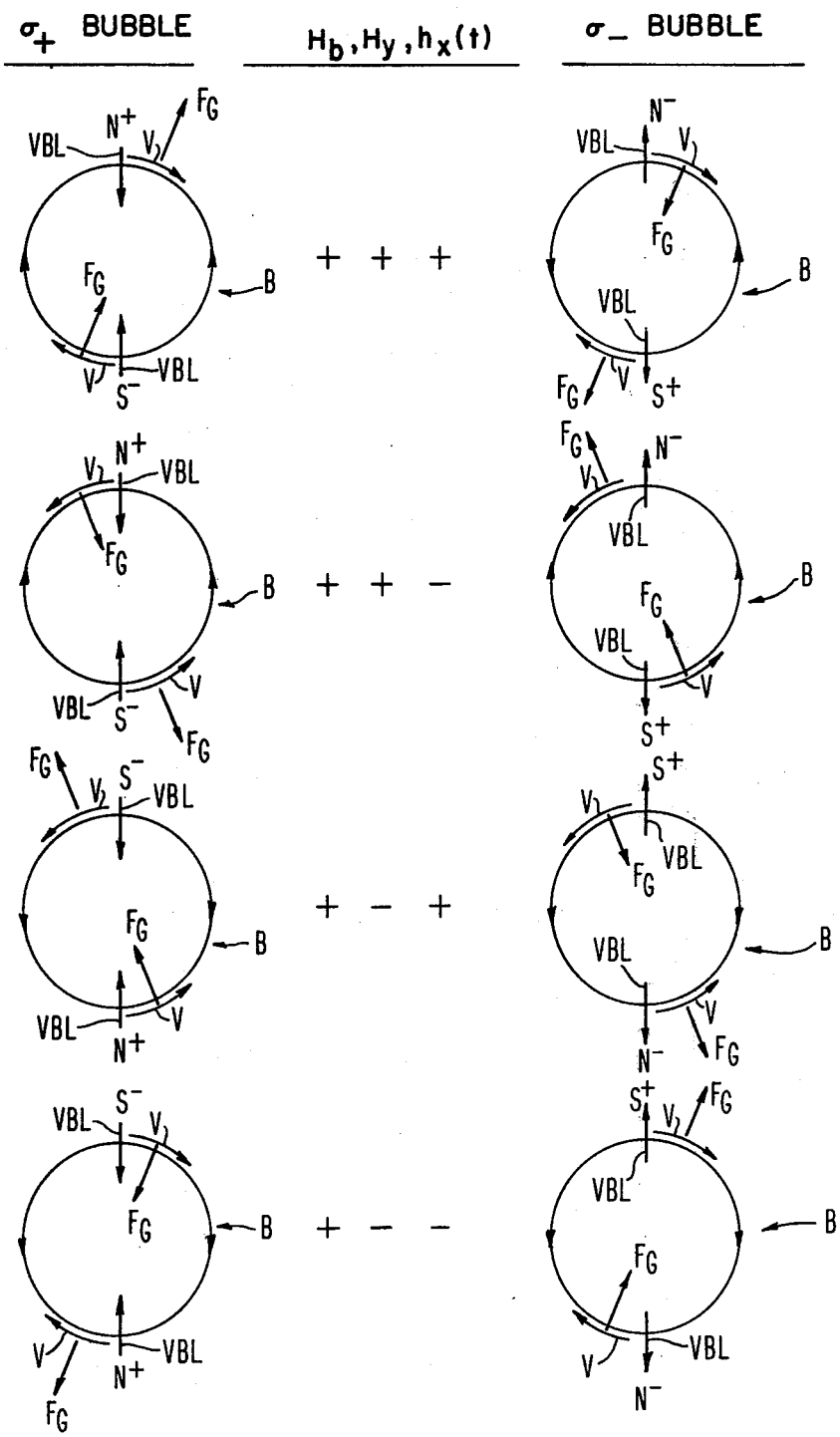
FIG. 8B illustrates the time integrated directions of type II automotion forces on $\sigma_+$ and $\sigma_-$ bubbles and the internal transient response of the Bloch lines when subjected to various combinations of the magnetic fields $H_y$, $h_x(t)$, and $H_b$, whose sign convention is shown in FIG. 8A.

FIGS. 8A and 8B illustrate time integrated directions of type II automotion forces on $\sigma_+$ and $\sigma_-$ bubbles and the internal transient response of the Bloch lines under certain sets of applied magnetic fields. In particular, FIG. 8A illustrates the positive sense of an in-plane, time varying magnetic field $h_x(t)$, a steady in-plane magnetic field $H_y$, and a steady bias field $H_b$. The bias field $H_b$ is used to stabilize the size of the $\sigma_+$ and $\sigma_-$ domains.

FIG. 8B illustrates the automotion type II direction of $\sigma_+$ and $\sigma_-$ domains under various orientations of the fields $h_x(t)$, $H_y$, and $H_b$. For example, if all of these magnetic fields are in the + direction, the top row in the diagram illustrates the transient Bloch line motion and the resultant forces which would act on the bubble domains B. For the $\sigma_+$ bubble, the vertical Bloch lines VBL's would circulate around the wall of domain B in a clockwise direction with a velocity V. This would lead to a gyrotropic force $F_G$ acting on each BL and directed as shown. Thus, the $\sigma_+$ domain would automote in the direction of the arrows representing the force $F_G$.

It should be noted that the $\sigma_-$ bubble moves in an opposite direction under the same set of applied magnetic fields $H_b$, $H_y$, and $h_x(t)$. Of course, this is a way of distinguishing $\sigma_+$ and $\sigma_-$ domains, and is similar to the technique for distinguishing these domains using type I automotion.

The remainder of FIG. 8B illustrates the automotion directions for the $\sigma_+$ and $\sigma_-$ domains in accordance with the direction of the fields $H_b$, $H_y$, and $h_x(t)$. In these examples, it should be noted that the direction of the steady in-plane field $H_y$ can be changed in order to change the direction of automotion. For instance, when the field $h_x(t)$ remains in the same direction and only the direction of $H_y$ is changed, the direction of automotion, given by the arrow $F_G$, changes as can be seen by comparing the first and third rows of bubble domains or by comparing the second and fourth rows of bubble domains in FIG. 8B.

The ability to easily change direction in type II automotion is an advantage with respect to type I automotion. In type I automotion, the z-field pulse $h_z(t)$ should be removed before the sign of the steady, restoring in-plane field is changed. Otherwise, a state change may occur since, in type I automotion, the vertical Bloch lines move in directions toward one another and are kept from annihilating one another only by the presence of the in-plane restoring field. However, in type II automotion, the vertical Bloch lines generally precess in the same circular direction around the domain wall. Therefore, the driving field $h_x(t)$ need not be removed before the sign of $H_y$ is changed.

As an example of the changes in automotion direction that can be easily achieved by changing the direction of the fields of $H_y$ and $h_x$ having positive senses as indicated in FIG. 8A, the following table illustrates the angle $\theta_A$ between the automotion direction of a $\sigma_-$ bubble and the positive direction of $h_x$. The pulse $h_x(t)$ has a rise time of 150 nsec, a width of 350 nsec, a fall time of about 1 μsec, and a maximum amplitude of 20 Oe.

| $H_y$ | $h_x$ | $\theta_A$ |
|---|---|---|
| + | + | 245° ± 3° |
| + | − | 143° ± 3° |
| − | + | −37° ± 3° |
| − | − | 65° ± 3° |

Thus four different directions of automotion can be achieved in type II automotion, compared with only two different directions of automotion that can be achieved by reversing the applied field directions in type I automotion.

EMBODIMENT 1 (FIGS. 9A, 9B, 9C, 9D and 10A, 10B)

Figure 9A:
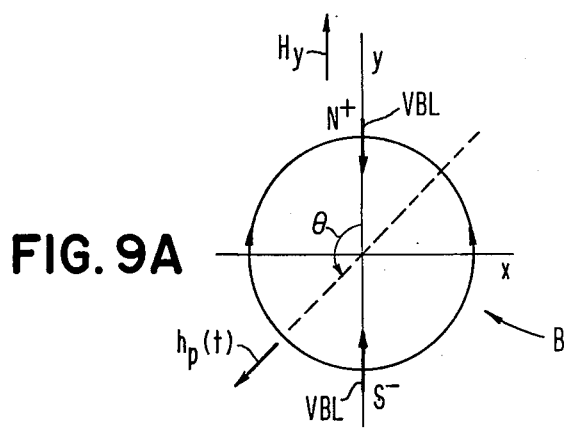
FIGS. 9A, 9B, 9C and 9D illustrate type II automotion using a first embodiment for producing type II automotion. Specifically.
Figure 9B:
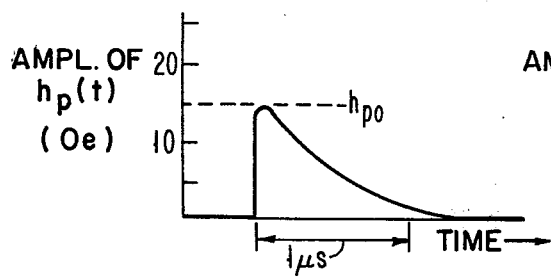
Figure 9C:
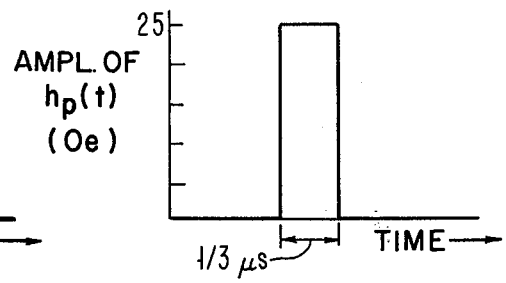

FIGS. 9A, 9B, 9C and 9D illustrate the effect which occurs when a steady in-plane field is present in combination with a time varying, in-plane magnetic field whose direction does not reverse. In this case, the steady in-plane field is in the $y$ direction and is denoted $H_y$. The time varying, in-plane field is $h_p(t)$ which is directed at an arbitrary angle $\theta$ with respect to the positive $y$ direction, as shown in FIG. 9A. The amplitude versus time waveforms of two different pulses $h_p(t)$ are shown in FIGS. 9B and 9C, where the maximum amplitude is $h_{po}$.

For the asymmetric pulse of FIG. 9B, the rise time of the pulse $h_p(t)$ is much faster than its fall time. The reason for this is that the precession of the wall magnetization vectors in the domain B must occur rapidly enough that the effects of coercivity are overcome so that the bubble domain can automote. On the other hand, the slow trailing edge of $h_p(t)$ will allow these wall magnetization vectors to relax to their former positions along the $y$-axis due to the pressure of the steady field $H_y$. This latter motion will again generate gyrotropic forces. However, if the transient time of the trailing edge of the pulse is sufficiently large (for example, three or four times the rise time), these gyrotropic forces will be smaller than the coercive force $H_c$, so that the bubble's position will not be changed. If the gyrotropic forces produced during relaxation of the wall vectors is sufficiently large to overcome the coercive force, there will be automotion of the domain in an opposite direction to that produced by the fast rise time of the pulse $h_p(t)$.

The pulse $h_p(t)$ in FIG. 9C has a fast rise and fall time, but the maximum amplitude of $h_p$ is greater than that of $h_p(t)$ in FIG. 9B. Hence, the magnitude ratio $h_{po}H_y$ in FIG. 9C is greater than that for FIG. 9B. When $h_p$ is removed, the VBL's will be restored to their original positions by $H_y$, but the net reaction force on the bubble will be less than when $h_p(t)$ was applied, since $h_{po}$ is greater than $H_y$. Consequently, there will be an asymmetry in forward and backward automotion and the net effect will be a forward displacement of the bubble. Thus, asymmetry of VBL motion during a complete cycle of the applied time-varying field, can occur if the field $h_p(t)$ has an asymmetric waveform, or if $h_p(t)$ has a symmetric waveform but has a maximum amplitude $h_{po}$ which is different than the amplitude of $H_y$ (either greater or less than $H_y$).

Figure 9D:
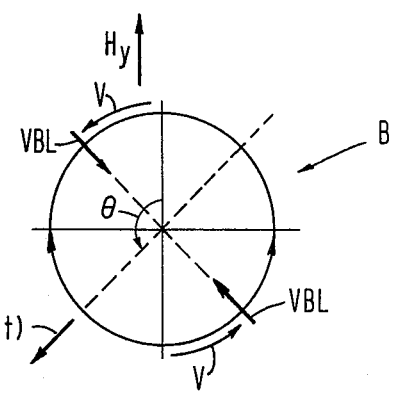
Figure 10A:
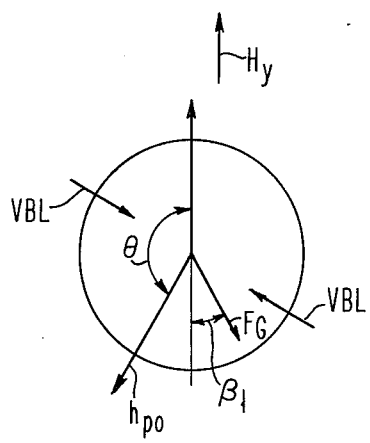
FIGS. 10A and 10B illustrate the change in direction of automotion depending upon the maximum amplitude $h_{po}$ of the modulated, in-plane magnetic field.
Figure 10B:
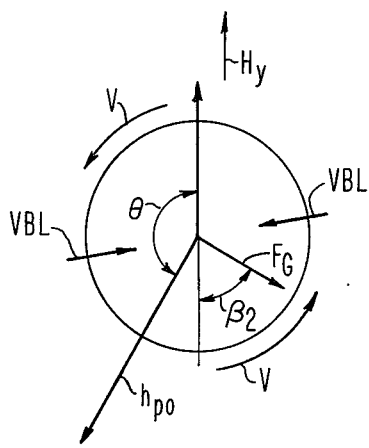

FIG. 9D illustrates the movement of the vertical Bloch lines VBL around the wall of the domain B when the pulse $h_p(t)$ is applied. The presence of the pulse $h_p(t)$ impels the vertical Bloch lines in a counterclockwise direction around the wall of the domain. Thus, the positive north pole is moved to the left while the negative south pole is moved to the right by the leading edge of this pulse. The fast leading edge of the pulse rapidly rotates these Bloch lines to a new equilibrium position, the motions of the Bloch lines generating cooperative gyrotropic forces $F_G$ (FIGS. 10A, 10B). These gyrotropic forces propel the bubble in a direction determined by the angle $\theta$ and the ratio of the peak intensity $h_{po}$ of the pulse field to the intensity of the steady in-plane field $H_y$. In a simple model with $h_{po} = H_y$, the acute angle $\theta$ between the automotion direction and the $y$-axis, neglecting propagational skew, is given by $$\beta = \arctan \frac{1 - \cos \theta/2}{\sin \theta/2}. \quad (7)$$

FIGS. 10A and 10B illustrate the automotion direction $\beta$ for two different pulses $h_p(t)$. The maximum amplitude $h_{po}$ is less in FIG. 10A than it is in FIG. 10B. Therefore, the angle $\beta_1$ in FIG. 10A is less than the angle $\beta_2$ in FIG. 10B. Of course, the directions of the fields $H_y$ and $h_p(t)$ can be changed in order to change the automotion direction.

Figure 11:
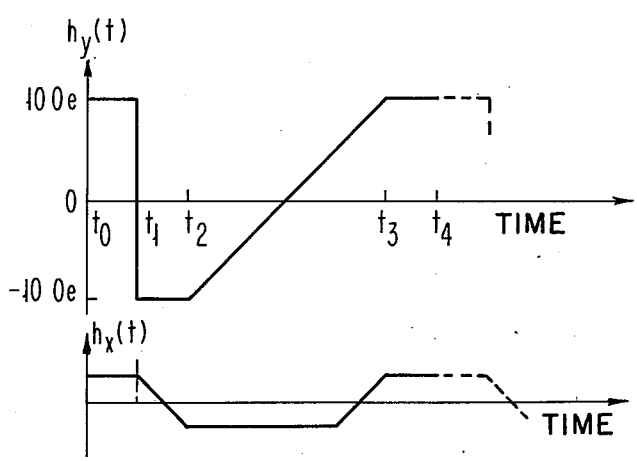
FIG. 11 illustrates another set of modulated in-plane fields used to provide type II automotion. In particular, the net magnetic field providing this automotion is a reorienting magnetic field.
Figure 12:
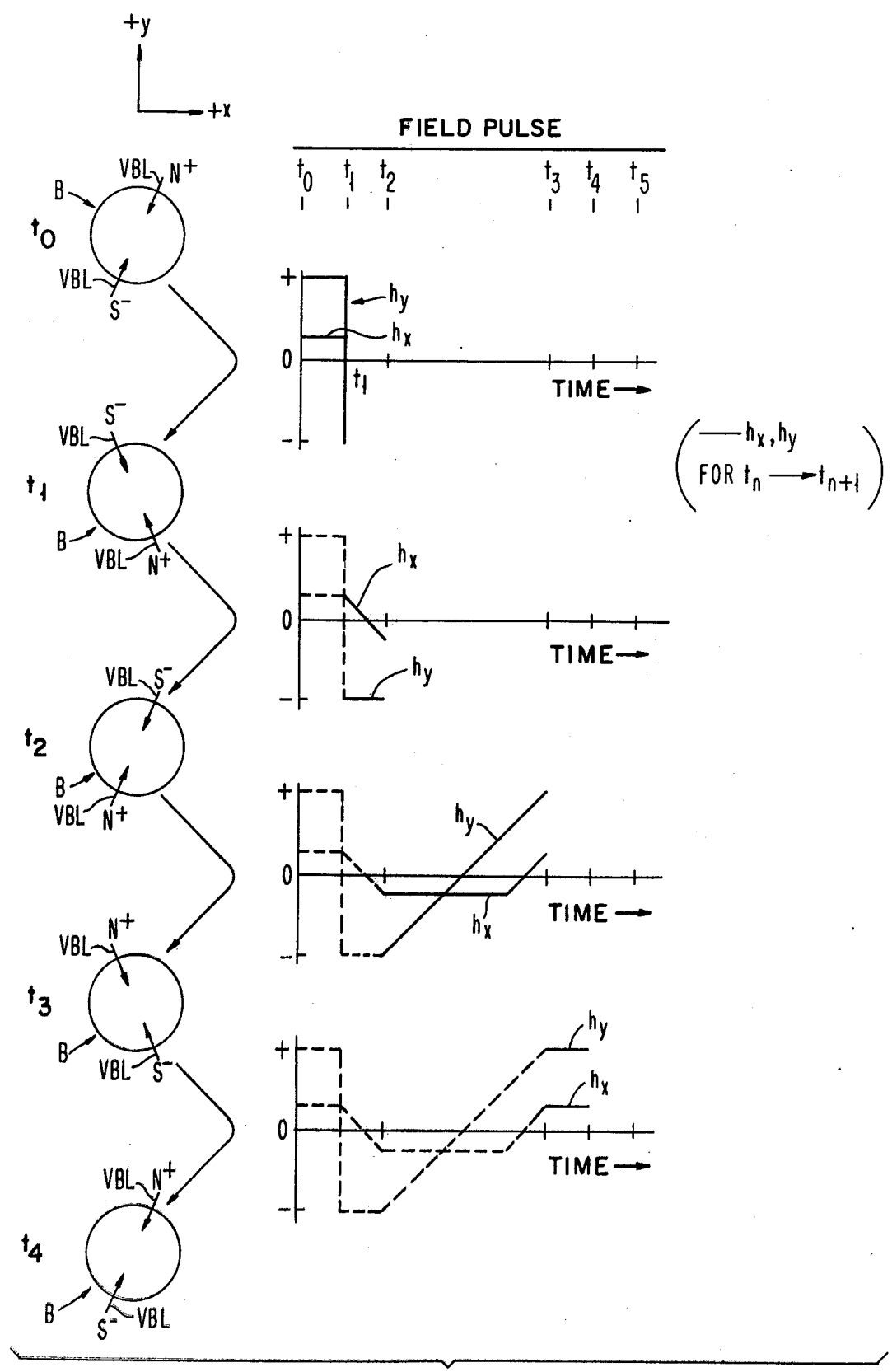
FIG. 12 illustrates a precession of wall magnetization vectors in a $\sigma_+$ bubble domain at various times in response to the application of the magnetic fields of FIG. 11.

EMBODIMENT 2 (FIGS. 11 and 12)

In this embodiment, two in-plane time modulated magnetic fields are used. These magnetic fields may be at arbitrary angles with respect to one another, but in the particular example illustrated in these figures, the time varying fields $h_x(t)$ and $h_y(t)$ are orthogonal to one another. A steady bias field $H_b$ is present for stabilizing the bubble diameter. As with embodiment 1, the time varying fields $h_x(t)$ and $h_y(t)$ can be provided by the field coils shown in FIG. 7. The current sources connected to these field coils will provide currents having waveforms similar to those shown in FIG. 11 so that those field waveforms will be easily provided. In particular, sine wave generators in combination with well known electronic circuits can be used to provide field waveforms of the type shown in FIG. 11.

In this embodiment, the net effect is that of a rotating, in-plane magnetic field which continually impels the distribution of wall magnetization vectors around the domain wall in a constant circular direction. Thus, continuous type II automotion is provided. This is in contrast with the automotion of embodiment 1, where the vertical Bloch lines circulate part way around the domain wall, reverse direction relaxing back to their original positions, and then circulate again as the next pulse is applied.

In this embodiment, the field $h_y(t)$ provides the major component of the force $\vec{h} = h_x\hat{x} + h_y\hat{y}$ which moves the Bloch lines around the wall of the domain for type II automotion. Additionally, this field $h_y(t)$ provides the holding force to keep the Bloch lines from annihilating one another. The field $h_x(t)$ provides an asymmetry so that the Bloch lines precess in the same direction around the wall of the domain each time the field $h_y(t)$ causes Bloch line precession. As will be apparent from FIG. 12, the field $h_x(t)$ keeps the position of the vertical Bloch lines offset from the y-axis so that they will move in a constant circular direction each time $h_y(t)$ appears.

The field $h_y(t)$ has a rapid fall time at time $t_1$ and at time $t_4$. This will produce rapid movement of the Bloch lines in the wall of the domain which in turn will lead to cooperative gyrotropic forces which move the domain in accordance with the principles previously described. The rise time of this field between times $t_2$ and $t_3$ is small so that VBL motion during that time interval is slow and the coercive force inhibits automotion in an opposite direction. On the other hand, field $h_x(t)$ has relatively slow rise and fall times between its plateaus and has a small amplitude in comparison to $h_y(t)$, and will therefore not produce automotion.

FIG. 12 illustrates the movement of vertical Bloch lines VBL's around the wall of the domain B at various times during the cycle $t_0$–$t_4$ of the applied fields $h_x(t)$ and $h_y(t)$. At time $t_0$, $h_y$ and $h_x$ have constant values where $|h_y|$ is larger than $|h_x|$. Consequently, the vertical Bloch lines will be slightly displaced from the y-axis due to the presence of the small field $h_x$ in the positive x-direction.

At time $t_1$, $h_y(t)$ undergoes a fast transition from a positive value to a negative value, while $h_x$ is still positive. Field $h_y$ causes circulation of the vertical Bloch lines in a clockwise direction around the bubble to achieve the equilibrium position illustrated for time $t_1$.

Between $t_1$ and $t_2$, $h_y$ remains constant, while $h_x$ slowly reverses in direction. This causes the vertical Bloch lines to move clockwise a small distance around the domain wall to the positions illustrated at time $t_2$.

Between times $t_2$ and $t_3$, $h_y$ changes very slowly to a positive value while $h_x$ remains substantially constant and then moves slowly to a positive value. The slow inversion of $h_y$ between $t_2$ and $t_3$ allows the vertical Bloch lines to return to their original equilibrium positions slowly, thus producing no net propulsion. The $h_x$ field insures that the vertical Bloch lines slowly return to their equilibrium position by moving in the same circulatory direction so that these Bloch lines do not meet and annihilate one another. Thus, as $h_y$ goes positive, the vertical Bloch lines move in a clockwise direction around the domain wall. When field $h_x$ begins to go positive, the Bloch lines will be brought to their original starting positions at time $t_4$ so that the sequence of applied fields can start again to continue automotion of the domain.

The maximum automotion velocity attainable by this cyclic process is limited by the minimum cycle time $t_4$–$t_0$ and by the threshold of instantaneous bubble velocity $V_T$ at which state changes can occur. Thus, the domains can be moved very rapidly without state changes as long as the threshold $V_T$ is not exceeded. For a 5 micron Eu-garnet sample having a threshold of approximately 1200 cm/sec., the in-plane field $h_y$ (in the case of a zero rise time) should be limited to approximately 10–12 Oe. Larger $h_y$ fields can also be used but with rise times limited in order to limit the bubble velocity to prevent state changes. A translation of approximately 1 micron was observed while switching with 10 Oe pulses of about 100 nsec rise time. The theoretical response to a step function switching of 10 Oe is approximately 2.2 microns, assuming the damping parameter $\alpha = 0.1$ and neglecting coercivity.

In the example of FIGS. 11 and 12, the cycle time is limited by the slow switching of $h_y(t)$ in the interval $t_4$–$t_2$, which is set to equal four or five times the transient switching time $\tau_s$ (the time lapse for the transient switching of the wall magnetization by the mechanism of circulatory VBL motions). The time interval $t_4$–$t_2$ is set this way in order that the gyrotropic forces are not significantly greater than the coercivity. Thus, for an interval $(t_4$–$t_2) = 0.25$ microseconds, a cycle time of 1 microsecond is obtained, which allows megacycle operation. It should be understood that this is just a representative example and that the resulting automotion average velocity can be improved using materials with smaller values of damping parameter $\alpha$ and larger threshold velocities so that the amplitude of $h_y(t)$ can be larger, and the rise time smaller.

Figure 13A:
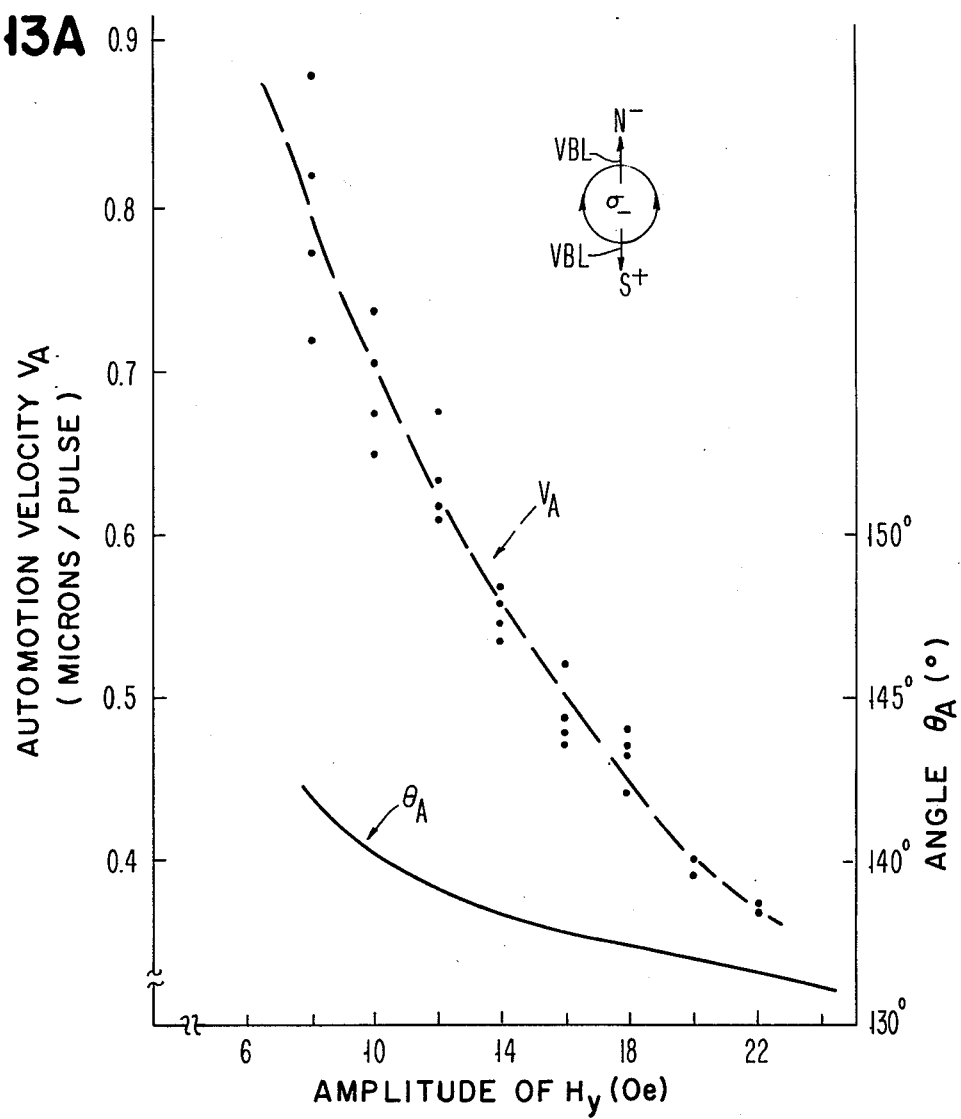
FIG. 13A is a graph of type II automotion velocity $V_A$ and angle of automotion $\theta_A$ for a $\sigma_-$ bubble, for various magnitudes of the steady in-plane field $H_y$.
Figure 13B:
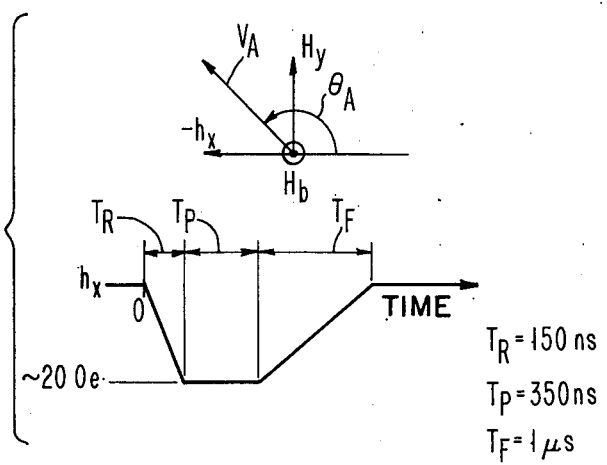
FIG. 13B illustrates the magnetic fields $H_y$, $H_z$, and $h_x(t)$ used to automote the $\sigma_-$ bubble whose velocity and automotion angle are plotted in FIG. 13A.

EXAMPLES (FIGS. 13A and 13B)

FIG. 13A is a plot of the automotion velocity $V_A$ and the automotion angle $\theta_A$ for different values of the steady in-plane field $H_y$. The steady field $H_y$ and the time varying field $h_x(t)$ are shown in FIG. 13B, which also illustrates the magnitude, rise and fall times, and duration of the $h_x(t)$ pulse. The data represented by these curves were obtained by applying the pulses $h_x(t)$ to a $\sigma_-$ bubble domain. The magnetic material supporting the $\sigma_-$ domain was $Gd_{1.02}Y_{1.03}Tm_{0.94}Ga_{0.83}Fe_{4.17}O_{12}$, having a magnetization M = 140G, $\alpha = 0.05$, h = 2.9 μm, l = 0.95 and Q ≃ 8. The $\sigma_-$ B domains had a diameter of about 8 microns which was maintained by a steady bias field $H_b = 30.8$ Oe.

As is apparent from FIG. 13A, the displacement of the bubble domain per applied pulse $h_x(t)$ increases as the amplitude of the restoring field $H_y$ decreases. The reason for this is that, for a given strength of automotion drive $h_x$, the vertical Bloch lines VBL will circulate greater distances and with larger average velocities as the magnitude of the restoring field $H_y$ decreases. This in turn means that the bubble domain center will displace more since the magnitude of the gyrotropic force $F_G$ increases as the velocity of the vertical Bloch lines increases. Thus, the displacement of the bubble center depends upon the velocity $rd\theta/dt$ during the circulation of the vertical Bloch lines around the wall of the bubble domain.

From FIG. 13A, it is apparent that the automotion angle $\theta_A$ does not change significantly with the magnitude of the restoring field $H_y$. The reason for this is that $h_x$ is greater in amplitude than $H_y$. As long as $|h_x| >> |H_y|$, the primary contribution to the applied field $\vec{h} = h_x \hat{x} + h_y \hat{y}$ is due to $h_x$, and changes in $|H_y|$ do not greatly affect the direction of the resultant field $\vec{h}$. Thus, small variations in automotion angle can be easily obtained merely by changing the amplitude of the field $H_y$ while large changes in direction are easily obtained by changing the sign of $H_y$ or $h_x$. This may be useful in, for instance, channel selection in a bubble domain device.

Figure 14:
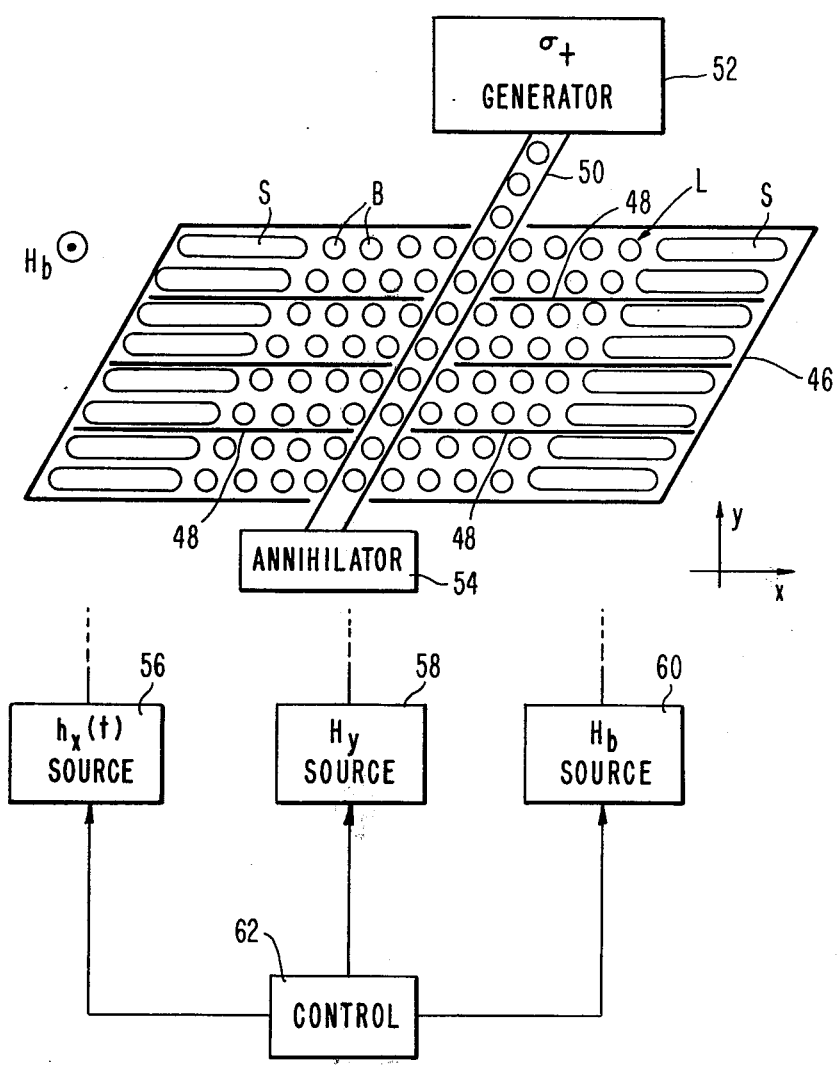
FIG. 14 illustrates a lattice of magnetic bubble domains in which movement of domains in the lattice in a plurality of directions is accomplished by type II bubble automotion.

FIG. 14 shows a structure for utilizing a lattice of magnetic bubble domains which automote, such as a lattice of $\sigma_+$ bubbles or a lattice of $\sigma_-$ bubbles. Using automotion, the bubbles in the lattice can be made to move either left or right depending upon the directions and amplitudes of the in-plane fields used for type II automotion. Lattice translation along a horizontal direction ($\pm x$) can be obtained. as well as automotion of a column of bubbles along a direction at an angle of 60° to the horizontal direction.

In more detail, FIG. 14 shows a lattice L of magnetic bubble domains B surrounded by buffer regions of stripe domains S. The entire lattice is enclosed within guide rails 46 and some guide rails 48 are located between rows of bubble domains and stripes in the lattice. This type of structure is known in the art and in particular is shown in U.S. Pat. No. 3,930,244. The guide structure 50 is in a direction transverse to the horizontal direction and extends from the $\sigma_+$ generator 52 to the annihilator 54.

Current source 56 is used to provide the time varying, in-plane magnetic field $h_x(t)$, while source 58 is used to provide field $H_y$. The bias field $H_b$ is provided by source 60. Sources 56, 58 and 60 operate under control of a control unit 62.

In operation, domains B in the lattice can be moved to the left or right by application of appropriate automotion fields. These fields would have appropriate directions and amplitudes in accordance with the principles described previously. Thus, when right-left motion is occurring, the stripe domains S in the buffer regions are changed in length in accordance with the teaching of U.S. Pat. No. 3,930,244. For instance, if domain motion is to the right, the stripe domains on the right-hand side of the lattice shrink in length due to the pressure of the $\sigma_+$ bubbles moving toward them, while the stripe domains in the left-hand buffer elongate due to the reduced pressure on them. Since the force due to automotion is a small force, guide rail 46 prevents the stripe domains from moving across the magnetic barrier presented by guide rail 46. Guide 50 is preferably comprised of two conductors as shown in aforementioned U.S. Pat. No. 3,930,244. With no currents in these conductors, automotion can be used to move a lattice of bubbles B back and forth across the guide 50. As an alternative, the guides 50 can be spaced sufficiently far from the bubble material that automotion forces will move bubbles past them. Also, interactions between the domains B and the stripes S will not push bubble domains out of their properly aligned rows due to the presence of the guide rails (dams) 48. Controlled automotion of the lattice in the $\pm x$ directions in this manner will bring a preferred column of bubble domains to the interior of transverse guide channel 50, where they can be removed from the lattice. Removal of a selected column of bubble domains from the lattice along the guide 50 occurs by changing direction/amplitude of the in-plane magnetic fields. Thus, the bubbles in the selected column are moved to a detector and then to an annihilator. Only the column in the guide channel 50 will be moved out of the lattice, since other columns will be prevented from moving by the dams 48. As domains are removed from the selected column, other domains are generated to take their place.

Thus, a lattice device is provided in which translation and removal of selected columns occurs due to the presence of automotion type II fields. No active structure, such as bubble domain pumps or magnetic overlays, is needed for actively interacting with the bubbles to either translate them or remove them from the lattice.

In accordance with the principles of the present invention, automotion type II can be used for translating bubble domains without overlay structure for producing gradient fields acting on the bubbles and for guiding bubble domains into selected channels. Thus, bubble domain direction devices can be provided by merely changing or applying automotion fields necessary to move bubble domains in selected directions. As an example, localized conductors overlying the bubble domain material can be used to provide local, in-plane magnetic fields for channel selection.

In the practice of this invention, orthogonal fields $h_x$ and $h_y$ have been illustrated. However, it will be immediately apparent to those of skill in the art that these in-plane fields can be at arbitrary angles with respect to one another.

Another use for automotion is in detection of different types of bubble domains. Depending upon the type of domain, type II automotion will cause propagation in different directions. This can be used to discriminate various types of bubble domains. Further, this discrimination can be associated with a bubble generator to provide only bubble domains of a certain type.

In the principle of type II automotion, time varying in-plane magnetic fields are provided to cause movements in wall magnetization vectors of the bubble domains. This in turn produces gyrotropic forces which cooperatively move the magnetic bubble domain. It should be noted that the angle between the fields $h_y$ and $h_x$ is arbitrary and can be chosen in accordance with design considerations. However, if the angle between these fields is 0°, no automotion will occur, since there will be no force for precession of Bloch lines at opposite ends of a bubble domain diameter aligned along the y-direction. Further, if the angle between $h_x$ and $h_y$ is 180°, an ambiguity will result. The vertical Bloch lines will want to move to opposite sides of the bubble domain but may precess in a common circular direction or in opposite circular directions. Thus, the angles 0° and 180° are not preferred for reliable type II automotion. However, ion-implanted garnet films have the property that $\sigma_+$ (or alternatively $\sigma_-$) states are preferentially preserved in a sufficiently large in-plane field. Therefore, satisfactory type II automotion is obtained using a 180° angle between the two in-plane fields.

Since in-plane magnetic fields are used for type II automotion, there is a better closure path for these magnetic fields than is the case for type I automotion fields which are directed normal to the bubble domain chip. Therefore, faster rise times will be obtained for in-plane fields which are uniform over large areas and the optimum velocities for type II automotion will be quite large.

Those of skill in the art will be able to envision various uses for the principle of type II automotion and will be able to speculate on different techniques for achieving this type of propagation. However, many of these will be within the skill of the art given the principles described herein.

What is claimed is:

1. An apparatus for moving magnetic bubble domains in a magnetic medium in the absence of magnetic field gradients acting on said bubbles, including:
   means for applying a first magnetic field in the plane of said medium,
   means for applying a second magnetic field in the plane of said magnetic medium, said second magnetic field being spatially uniform and time varying, said second magnetic field changing sufficiently rapidly and having sufficient magnitude to move said bubbles in said magnetic medium.

2. The apparatus of claim 1, where said first magnetic field also varies with time.

3. The apparatus of claim 1, where said second magnetic field is directed in first and second opposing directions during different times.

4. The apparatus of claim 1, where said second magnetic field is a pulse field whose rise time is unequal to its fall time.

5. The apparatus of claim 1, where said bubble domains are characterized by the presence of separated clusters of unwinding wall transitions each of which includes at least one vertical Bloch line.

6. The apparatus of claim 1, where said bubble domain is characterized by the presence of horizontal Bloch lines in its wall magnetization.

7. The apparatus of claim 1, where the angle between the direction of said first magnetic field and said second magnetic field is about 90°.

8. The apparatus of claim 1, where the function of said first magnetic field is supplied by an orthorhombic magnetocrystalline anisotropy.

9. The apparatus of claim 1, where the function of said first magnetic field is supplied by a tilt of the crystallographic axis of the magnetic medium with respect to the plane of said medium.

10. An apparatus for displacing the center of a magnetic bubble domain a distance $x$ in a magnetic medium, comprising:
    means for causing circulation of Bloch lines in the wall of said bubble domain in a common circular direction around the wall of said bubble domain to change the magnetization distribution along the wall of said domain, said circulation being sufficiently fast to produce a reaction force which moves said bubble the distance $x$.
    means for restoring said Bloch lines along the wall of said bubble domain toward their original positions prior to said circulation.

11. The apparatus of claim 10, where said means for restoring includes means for moving said wall magnetization vectors in said common circular direction toward their original relative distribution.

12. The apparatus of claim 11, where said means for causing said circulation includes means for applying a spatially uniform, time varying magnetic field in the plane of said magnetic medium.

13. The apparatus of claim 12, where said means for restoring includes means for producing a magnetic field in the plane of said magnetic medium.

14. The apparatus of claim 13, where said second magnetic field is a spatially uniform time varying magnetic field.

15. The apparatus of claim 10, where said means for causing circulation includes means for circulating said wall moment magnetization vectors at a rate sufficiently fast to produce said reaction force which is sufficient to overcome the coercivity of said bubble medium.

16. The apparatus of claim 10, where said bubble domain has separated clusters containing at least one vertical Bloch line in each said cluster.

17. An apparatus for displacing the center of a bubble domain by a distance $x$ without using magnetic fields having spatial gradients, said bubble domains being characterized by domain walls having a wall magnetization vector distribution therein including at least one pair of unwinding Bloch lines, comprising:
    means for circulating said wall magnetization distribution around the periphery of said domain wall at a velocity sufficiently great to produce reaction forces overcoming the coercivity of the bubble domain material, said means for circulating including means for applying a time varying magnetic field in the plane of said magnetic medium having sufficiently fast rise or fall time and sufficient magnitude to produce said velocity of said wall magnetization vector distribution,
    means for restoring said wall magnetization distribution toward its original position before application of said in-plane magnetic field, where said restoration occurs at a velocity less than that which would produce a reaction force overcoming the coercivity of said bubble domain material.

18. The apparatus of claim 17, where said bubble domain contains separate clusters of vertical Bloch lines, there being at least one vertical Bloch line in each cluster.

19. The apparatus of claim 18, where the Bloch lines in each said cluster have opposite twists.

20. The apparatus of claim 17, where said means for restoring includes means for applying a spatially uniform magnetic field substantially in the plane of said magnetic medium.

21. An apparatus for manipulating magnetic bubble domains having at least one pair of unwinding Bloch lines in their domain walls in a magnetic medium, comprising:
    means for confining said bubble domains in a lattice of such domains where the positions of said domains in said lattice are sufficiently close to one another that interactions exist between said bubble domains in said lattice,
    means for propagating bubble domains in said lattice, said means for propagating including means for applying a spatially uniform time varying magnetic field in the plane of said magnetic medium, said magnetic field having a magnitude and a rise time or fall time sufficiently fast to produce reaction forces sufficient to overcome coercivity of the magnetic medium for movement of the bubble domains in said lattice.

22. The apparatus of claim 21, including means for removing bubble domains from said lattice, said means for removing including means for applying a spatially uniform, time varying magnetic field in the plane of said magnetic medium of sufficient magnitude and with sufficiently fast rise or fall time to produce forces overcoming coercivity of the magnetic medium for removal of said bubble domains from said lattice.

23. A method for propagation of a magnetic bubble domain in a magnetic medium, said domain having at least one pair of unwinding Bloch lines in its domain wall, comprising:

circulating said pair of Bloch lines around said domain wall from a first position to a second position by application of a spatially uniform, time-varying magnetic field substantially in the plane of said magnetic medium, circulating said pair of Bloch lines from said second position toward said first position, where the velocity of circulation of said Bloch lines when moving from said first position to said second position is different than the velocity of circulation of said Bloch lines when moving from said second positon to said first position.

24. The method of claim 23, further including application of a second magnetic field in the plane of said magnetic medium.

25. The method of claim 24, where the magnitude of said second field is less than the maximum magnitude of said time varying field.

* * * * *